(12) United States Patent
Obinata

(10) Patent No.: US 7,176,562 B2
(45) Date of Patent: Feb. 13, 2007

(54) SEMICONDUCTOR WAFER, SEMICONDUCTOR DEVICE, METHOD FOR MANUFACTURING THE SEMICONDUCTOR DEVICE, CIRCUIT BOARD, AND ELECTRONIC APPARATUS

(75) Inventor: Takayoshi Obinata, Fajimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 310 days.

(21) Appl. No.: 10/803,192

(22) Filed: Mar. 17, 2004

(65) Prior Publication Data
US 2005/0023669 A1 Feb. 3, 2005

(30) Foreign Application Priority Data
Mar. 20, 2003 (JP) ............................... 2003-078098

(51) Int. Cl.
*H01L 23/48* (2006.01)
(52) U.S. Cl. ....................................... 257/692; 257/678
(58) Field of Classification Search ................ 257/678, 257/692
See application file for complete search history.

(56) References Cited

U.S. PATENT DOCUMENTS
5,371,411 A * 12/1994 Hara et al. ................... 257/775
6,323,542 B1 11/2001 Hashimoto

FOREIGN PATENT DOCUMENTS
JP 2002-093947 3/2002

* cited by examiner

*Primary Examiner*—Doug Menz
(74) *Attorney, Agent, or Firm*—Hogan & Hartson LLP

(57) ABSTRACT

A semiconductor wafer includes a semiconductor substrate having a plurality of integrated circuits and electrical interconnections electrically connected to each of the integrated circuits. The semiconductor substrate includes bonding pads formed on a surface of the semiconductor substrate. Each of the bonding pads is part of a corresponding electrical interconnection. First resin layers are each disposed on each of a plurality of areas on the semiconductor substrate and have ridged edges. Wirings are each disposed over a corresponding bonding pad and a corresponding first resin layer and are electrically connected to the corresponding bonding pad. External connection terminals are each disposed on a corresponding wiring and are electrically connected to the corresponding wiring.

3 Claims, 4 Drawing Sheets

SEMICONDUCTOR WAFER, SEMICONDUCTOR DEVICE, METHOD FOR MANUFACTURING THE SEMICONDUCTOR DEVICE, CIRCUIT BOARD, AND ELECTRONIC APPARATUS

BACKGROUND OF THE INVENTION

1. Field of the Invention

The present invention relates to a semiconductor wafer, a semiconductor device, a method for manufacturing the semiconductor device, a circuit board, and an electronic apparatus.

2. Description of the Related Art

Bare chip mounting is preferable for high density mounting in semiconductor devices. However, quality control and handling of bare chips are difficult. For this reason, a semiconductor device to which the chip size/scale package (CSP) technology is applied has been developed. Particularly, in recent years, the wafer level CSP has received attention. In the wafer level CSP, wirings are formed on a first resin layer, the entire wafer is packaged, and then the wafer is cut into separated packages. In the CSP, the external connection terminals (for example, solder balls) and wirings can be formed on only restricted areas.

Accordingly, an advantage of the present invention is to provide increased areas for forming the external connection terminals or the wirings.

SUMMARY OF THE INVENTION

A semiconductor wafer according to an embodiment of the present invention includes a semiconductor substrate having a plurality of integrated circuits and electrical interconnections electrically connected to each of the integrated circuits. The semiconductor substrate includes bonding pads formed on a surface of the semiconductor substrate with each of the bonding pads being part of the corresponding electrical interconnections. First resin layers are each disposed on each of a plurality of areas on the semiconductor substrate and have ridged edges. Wirings are each disposed over the corresponding bonding pads and the corresponding first resin layer and are electrically connected to the corresponding bonding pad. External connection terminals are each disposed on the corresponding wiring and electrically connected to the corresponding wiring. According to an embodiment of the present invention, the first resin layer has ridged edges in which the surface area of each of the ridged edges is wider than the projected area thereof Thus, areas for forming the external connection terminals or the wirings increase on the first resin layer.

In this semiconductor wafer, each of the wirings may extend over the corresponding ridged edge and at least part of each of the external connection terminals may be disposed above the corresponding ridged edge.

A semiconductor device according to an embodiment of the present invention includes a semiconductor chip having an integrated circuit and electrical interconnections electrically connected to the integrated circuit. The semiconductor chip includes bonding pads formed on a surface of the semiconductor chip. Each of the bonding pads are part of the corresponding electrical interconnection. A first resin layer is disposed on the semiconductor chip and has ridged edges. Wirings are each disposed over the corresponding pad and the first resin layer and are electrically connected to the corresponding bonding pad. External connection terminals are each disposed on the corresponding wirings and electrically connected to the corresponding wiring. According to an embodiment of the present invention, the first resin layer has ridged edges. The surface area of each of the ridged edges is wider than the projected area of each of the same ridged edges. Thus, areas for forming the external connection terminals or the wirings increase.

According to an embodiment of the present invention, in the semiconductor device, each of the wirings extends over the corresponding ridged edge and at least part of each of the external connection terminals may be disposed above the corresponding ridged edge.

A circuit board according to an embodiment of the present invention includes the semiconductor device mounted on the circuit board. An electronic apparatus according to an embodiment of the present invention includes the semiconductor device.

A method for manufacturing a semiconductor device according to an embodiment of the present invention includes forming a resin precursor layer on a semiconductor substrate having an integrated circuit and electrical interconnections electrically connected to the integrated circuit. The semiconductor substrate includes bonding pads formed on a surface of the semiconductor substrate with each of the bonding pads being part of the corresponding electrical interconnection. The method also includes forming a first resin layer having ridged edges with the first resin layer being formed by curing shrinkage andforming wiring with each of the wirings being disposed over the corresponding bonding pad and the corresponding first resin layer and being electrically connected to the corresponding bonding pad. The method further includes forming external connection terminals with each of the external connection terminals being disposed on the corresponding wiring and being electrically connected to the corresponding wiring. According to the present invention, the first resin layer has ridged edges in which the surface area of each of the ridged edges is wider than the projected area of the corresponding ridged edge. Thus, areas for forming the external connection terminals or the wirings increase.

In the method for manufacturing the semiconductor device according to an embodiment of the present invention, each of the wirings may extend over the corresponding ridged edge.

Also, in the method for manufacturing the semiconductor device according to an embodiment of the present invention, at least part of each of the external connection terminals may be formed above the corresponding ridged edge.

Finally, in the method for manufacturing the semiconductor device according to an embodiment of the present invention, the resin precursor layer may be subjected to curing shrinkage by heating.

DETAILED DESCRIPTION OF THE PREFERRED EMBODIMENTS

The embodiments of the present invention will now be described with reference to the drawings.

FIGS. 1 to 5 illustrate a method for manufacturing the semiconductor device according to the present invention. In this embodiment, a semiconductor substrate 10 is used. The semiconductor substrate 10 includes a plurality of integrated circuits 12. When the semiconductor substrate 10 is cut into a plurality of separate semiconductor chips, the separated semiconductor chips have the respective integrated circuits 12.

A passivation layer 14 may be formed on a surface of the semiconductor substrate 10. For example, the passivation layer 14 may be formed of an inorganic material such as silicon dioxide ($SiO_2$) or silicon nitride (SiN). The passivation layer 14 may include a plurality of sublayers. In this case, at least one sublayer (for example, the uppermost sublayer) may be formed of an organic material.

The bonding pads 16 are formed on the semiconductor substrate 10. Each of the bonding pads 16 is part of, for example, an edge of the corresponding electrical interconnection electrically connected to the integrated circuits 12 (for example, semiconductor integrated circuits). The passivation layer 14 is not disposed on at least the middle area of each of the bonding pads 16.

Figure 1:
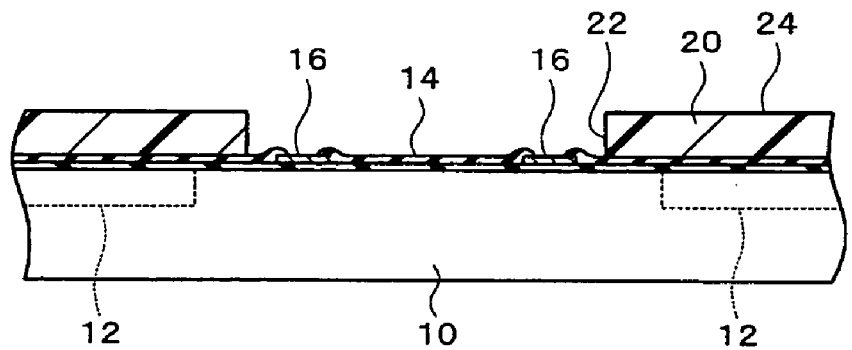
FIG. 1 is a cross-sectional view taken along the line I—I in FIG. 2.

As shown in FIG. 1, resin precursor layers 20 are formed on the semiconductor substrate 10. The resin precursor layers 20 may be formed on the semiconductor substrate 10 by applying or spin-coating a resin precursor, for example, a thermosetting resin precursor. In this embodiment, the resin precursor layers 20 are uncured. Each of the resin precursor layers 20 may include a plurality of sublayers or a single layer. The resin precursor layers 20 are electrical insulators. After the resin precursor layers 20 are cured (polymerized), the cured first resin layers may have a stress relieving function. The resin precursor layers 20 may be formed of a resin precursor, for example, a polyimide resin, a silicone modified polyimide resin, an epoxy resin, a silicone modified epoxy resin, benzocyclobutene (BCB), or polybenzoxazole (PBO). The resin precursor layers 20 cannot contain electrically conductive particles. The resin precursor layers 20 may be formed of a light shielding material.

The resin precursor layers 20 may be formed of a radiation-sensitive resin precursor that is sensitive to radiation such as light (ultraviolet light and visible light), X-rays, and an electron beam. The radiation-sensitive resin precursor such as a photosensitive resin precursor includes a negative type in which a radiation exposed area of the resin precursor becomes insoluble and a positive type in which a radiation exposed area of the resin precursor has increased solubility.

Figure 2:
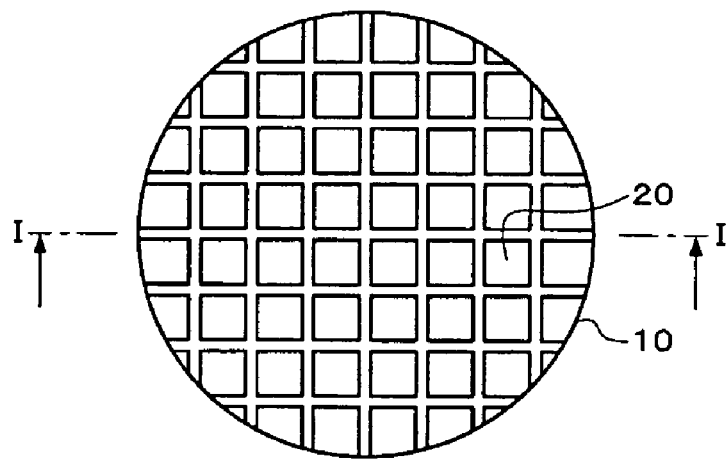
FIG. 2 illustrates a method for manufacturing a semiconductor device according to an embodiment of the present invention.

Each of the resin precursor layers 20 may not be disposed on the corresponding bonding pad 16. The resin precursor layers 20 may not be disposed on areas for cutting the semiconductor substrate 10. The resin precursor layers 20 may be patterned after the resin precursor layer and the resin precursor layer is continuously or integrally formed with the semiconductor substrate 10. FIG. 2 illustrates the patterned resin-precursor-layer. FIG. 1 is a cross-sectional view taken along the line I—I in FIG. 2. As shown in FIG. 2, each of the resin precursor layers 20 may be formed on each of a plurality of areas on the semiconductor substrate 10. Spaces are provided between adjacent resin precursor layers 20. Side faces 22 of the resin precursor layers 20 may be perpendicular to the surface of the semiconductor substrate 10. Top faces 24 of the resin precursor layers 20 may be flat, for example, parallel to the surface of the semiconductor substrate 10.

Figure 3:
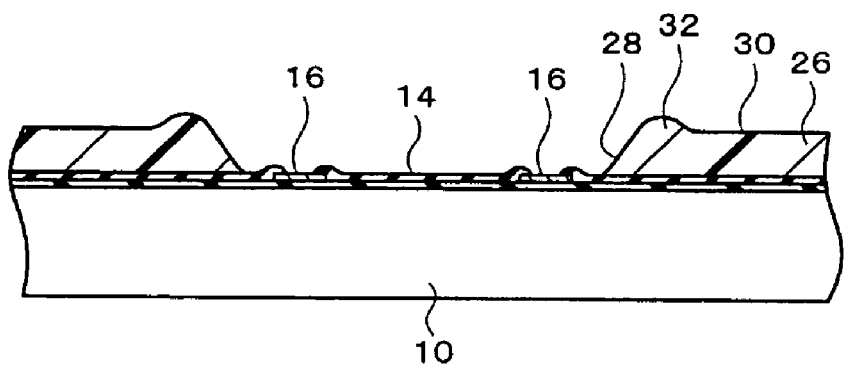
FIG. 3 illustrates a method for manufacturing a semiconductor device according to an embodiment of the present invention.

As shown in FIG. 3, first resin layers 26 are formed by curing shrinkage of the resin precursor layers 20. When the resin precursor layers 20 are composed of a thermosetting resin precursor, the resin precursor layers 20 are subjected to curing shrinkage by heating. The first resin layers 26 may have inclined side faces 28 inwardly relative to the side faces 22 of the resin precursor layers 20. Alternatively, the first resin layers 26 may have the inwardly inclined side faces 28 formed by curing shrinkage of the side faces 22, which are perpendicular to the surface of the semiconductor substrate 10, of the resin precursor layers 20. Top faces 30 of the first resin layers 26 may be flat, for example, parallel to the surface of the semiconductor substrate 10. Each of the top faces 30 of the first resin layers 26 may also be inclined from the edge to the direction of the middle area on the surface of a corresponding first resin layer 26.

Each of the first resin layers 26 has ridged edges 32. The ridged edges 32 may be formed by curing shrinkage of the resin precursor layers 20. The surface area of each of the ridged edges 32 is wider than the projected area of the same corresponding ridged edge. The actual surface area of each of the top faces 30, which includes ridged edges 32, of the first resin layers 26 is wider than the projected area of the same corresponding ridged edge. Thus, areas for forming the external connection terminals 44 or the wirings 40 increase on the first resin layer 26.

Figure 4:
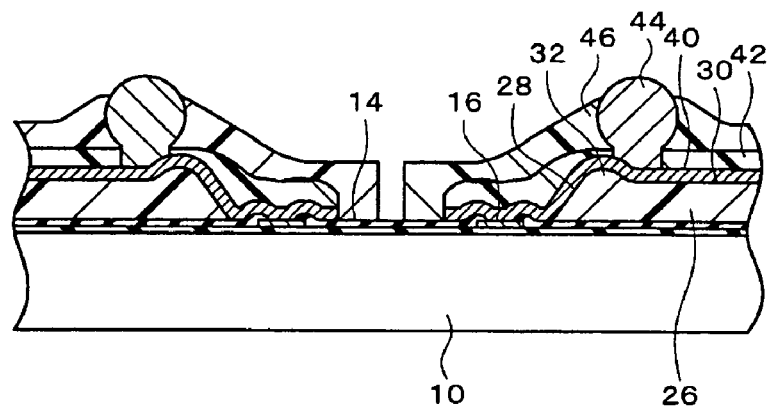
FIG. 4 illustrates a method for manufacturing a semiconductor device according to an embodiment of the present invention.

As shown in FIG. 4, the wirings 40 are formed on the first resin layers 26. The wirings 40 may be formed of a single layer or a plurality of sublayers. For example, a titanium tungsten (TiW) layer and a copper (Cu) layer are laminated by sputtering, and then a Cu layer may be further formed on the laminated layers. A known art can be applied for forming the composite. Each of the wirings 40 is formed so as to extend on the corresponding bonding pad 16, in other words, to be electrically connected to the corresponding bonding pad 16. Each of the wirings 40 extends over the corresponding bonding pad 16 and the corresponding first resin layer 26. Each of the wirings 40 may extend over the corresponding side face 28 of the first resin layer 26. Each of the wirings 40 is formed so as to extend over the corresponding ridged edge 32. Since the wirings 40 are bent on the ridged edges 32, the wirings barely break even if the resin precursor layers 20 deform. Each of the wirings 40 may be formed so as to have a land which has a wider width than that of the wirings. The land is an area to provide each of the external connection terminals 44 on the corresponding land.

Each of second resin layers 42 may be formed on the corresponding first resin layer 26. The descriptions of the first resin layers 26 may also be applicable to the second resin layers 42. Alternatively, the second resin layers 42 may be solder resists. Each of the second resin layers 42 may be formed so as to cover the entire or the part (for example, an area except for the middle area of the land) of the corresponding wiring 40. The second resin layers 42 may be formed so as to expose areas for cutting the semiconductor substrate 10.

The external connection terminals 44 are formed. At least part of each of the external connection terminals 44 may be disposed above the corresponding ridged edge 32, for example, above the top faces of the corresponding ridged edge. The external connection terminals 44 may be composed of either soft solder or hard solder. Lead-free solder may be used for the soft solder. The lead-free solder such as tin-silver (Sn—Ag), tin-bismuth (Sn—Bi), tin-zinc (Sn—Zn), and tin-copper (Sn—Cu) based alloys may be used. These alloys may further contain at least any one of silver, bismuth, zinc, and copper. A known method can be applied to form the external connection terminals 44.

Third resin layers 46 may be formed on the respective second resin layers 42. The descriptions of the first resin layers 26 are applicable to the third resin layers 46. The third resin layers 46 may be formed so as to cover the respective second resin layers 42. The third resin layers 46 may be formed so as to expose areas for cutting the semiconductor substrate 10. Each of the third resin layers 46 may cover the side faces of the corresponding second resin layer 42 adjacent to the cutting areas of the semiconductor substrate. Each of the third resin layers 46 may cover the part (for example, the base area) of each of the external connection terminals 44. The third resin layers 46 may be formed by patterning a solid resin layer that is formed so as to cover the entire semiconductor substrate 10. Alternatively, the third resin layers 46 may be formed by a solid resin layer on the entire external connection terminals 44 and then by removing the solid resin layer at the top ends of the third resin layers 46. The descriptions of patterning for the resin precursor layer 20 are applicable to the patterning for forming the third resin layers. Alternatively, parts of the third resin layers 46 may be removed by laser irradiation or ashing.

The semiconductor wafer according to the present invention includes the semiconductor substrate 10. The semiconductor substrate 10 includes a plurality of the integrated circuits 12 (see FIG. 1) and the bonding pads 16 on a surface of the semiconductor substrate. Each of the bonding pads 16 is part of each of the electrical interconnections electrically connected to the corresponding integrated circuit 12. Each of the first resin layers 26 having ridged edges is formed on each of the plurality of areas on the semiconductor substrate 10. Each of the wirings 40 is disposed over the corresponding bonding pad 16 and the corresponding first resin layer 26 and is formed so as to be electrically connected to the corresponding bonding pad 16. Each of the external connection terminals 44 is formed on the corresponding wiring 40 and is formed so as to be electrically connected to the corresponding wiring 40. Other details are the same as described above. According to this embodiment, the first resin layer 26 has ridged edges 32 in which the surface area of each of the ridged edges 32 is wider than the projected area of the same ridged edge. Thus, areas for forming the external connection terminals 44 or the wirings 40 increase.

Figure 5:
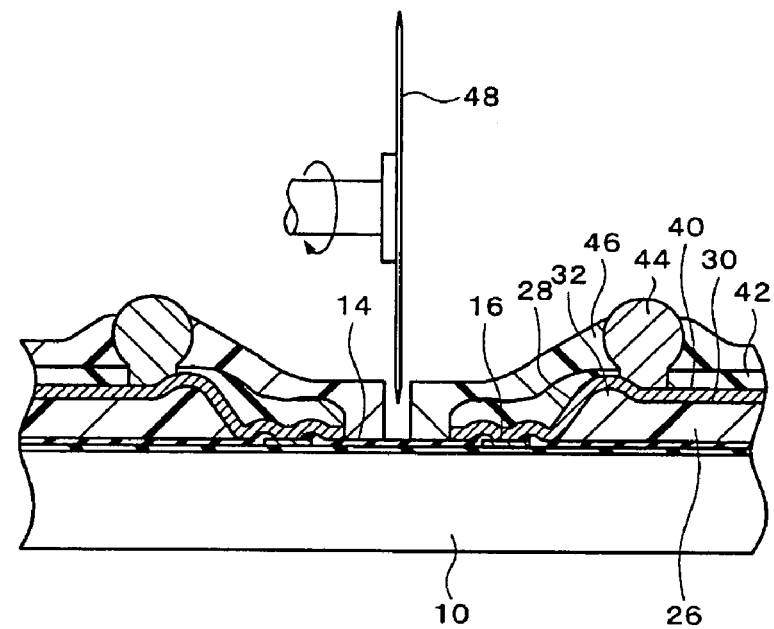
FIG. 5 illustrates a method for manufacturing a semiconductor device according to an embodiment of the present invention.

As shown in FIG. 5, the semiconductor substrate 10 may be cut by, for example, scribing or dicing. The first, second, and third resin layers 26, 42, and 46 are formed so as not to be formed on the cutting areas of the semiconductor substrate 10. Thus, these resin layers are not cut; hence, clogging of a cutter (or a blade) 48 can be prevented. In this way, the semiconductor device can be obtained.

Figure 6:
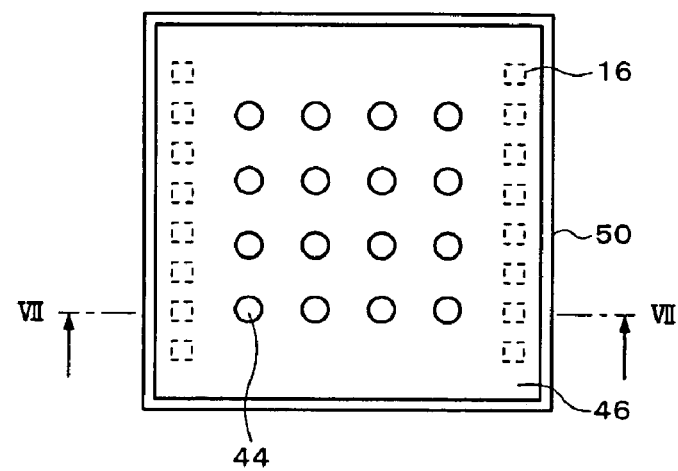
FIG. 6 illustrates a semiconductor device according to an embodiment of the present invention.
Figure 7:
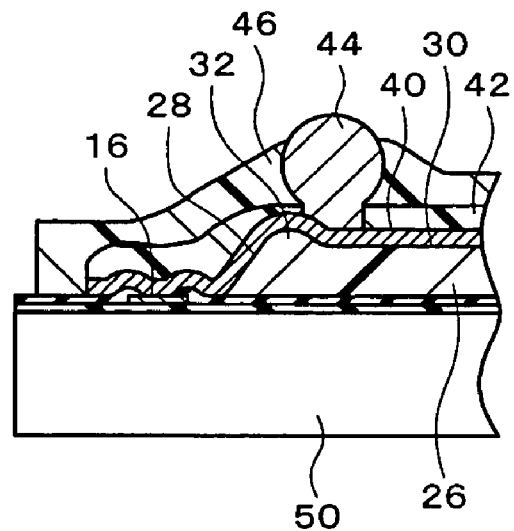
FIG. 7 is an enlarged partial cross-sectional view taken along line the VII—VII in FIG. 6.

FIG. 6 illustrates the semiconductor device according to this embodiment, and FIG. 7 is a cross-sectional view taken along the line VII—VII in FIG. 6. The semiconductor device includes a semiconductor chip 50. The semiconductor chip 50 includes the integrated circuit 12 (see FIG. 1) and the bonding pads 16 on the surface of the semiconductor chip. Each of the bonding pads 16 is part of each of the electrical interconnections electrically connected to the integrated circuit 12. The first resin layer 26 having the ridged edges is formed on the semiconductor chip 50. Each of the wirings 40 is disposed over the corresponding bonding pad 16 and the corresponding first resin layer 26 and is formed so as to be electrically connected to the corresponding bonding pad 16. Each of the external connection terminals 44 is formed on the corresponding wiring 40 and is formed so as to be electrically connected to the corresponding wiring 40. The semiconductor chip 50 may be cut from the semiconductor substrate 10. Other details are the same as described above.

Figure 8:
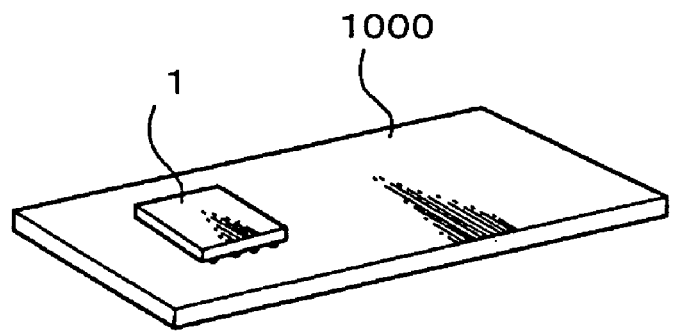
FIG. 8 illustrates a circuit board mounting a semiconductor device according to an embodiment of the present invention.
Figure 9:
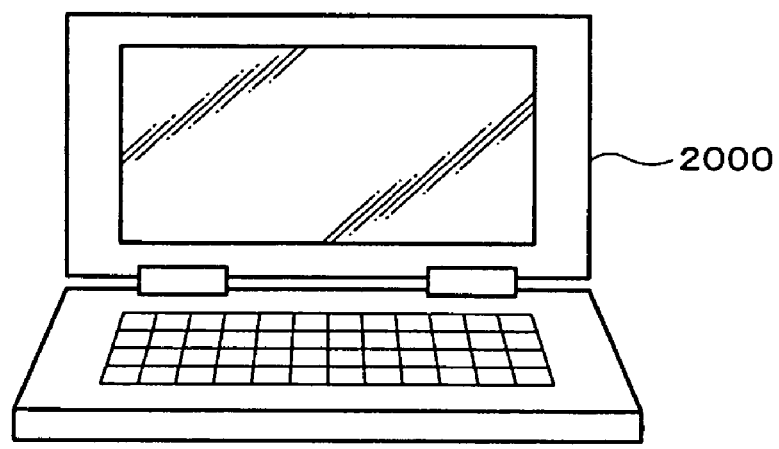
FIG. 9 illustrates an electronic apparatus including a semiconductor device according to an embodiment of the present invention.
Figure 10:
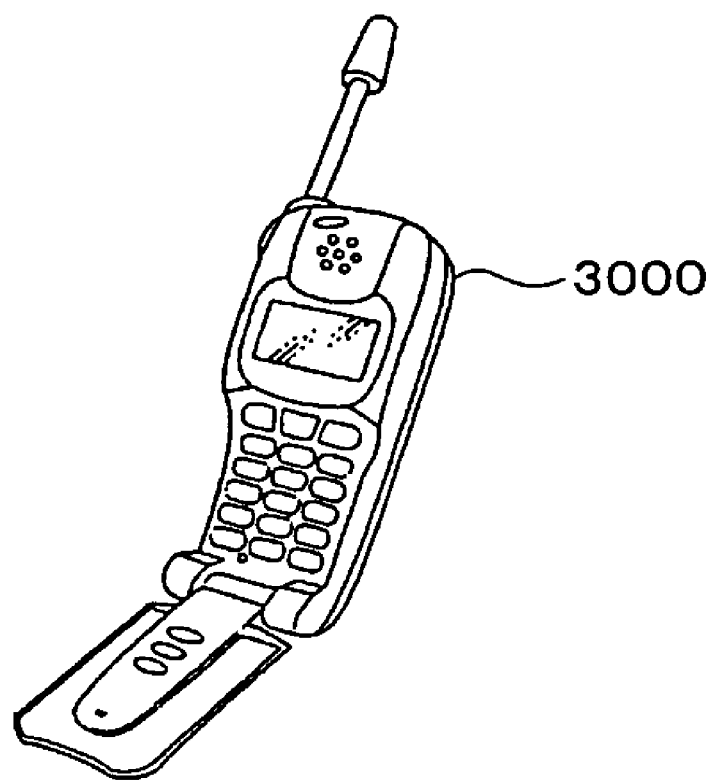
FIG. 10 illustrates an electronic apparatus including a semiconductor device according to an embodiment of the present invention.

FIG. 8 shows a circuit board 1000 mounting a semiconductor device 1 described in above-mentioned embodiment. FIG. 9 shows a notebook personal computer 2000 and FIG. 10 shows a cellular phone 3000 as an electronic apparatus including this semiconductor device.

The present invention is not limited to above-mentioned embodiments and can include a variety of modifications. For example, the present invention includes a structure which is substantially equivalent to the structure described in the embodiments. The substantially equivalent structure is, for example, a structure that has the same function, method, and result, or the same object and result. Further, the present invention includes a structure in which an extrinsic part of the structure described in the embodiments is replaced. Furthermore, the present invention includes a structure that has the same effect or can achieve the same object as the structure described in the embodiments. In addition, the present invention includes a structure that is added a known art to the structure described in the embodiments.

What is claimed is:

1. A semiconductor device comprising:
   a semiconductor chip having an integrated circuit and electrical interconnections electrically connected to the integrated circuit, the semiconductor chip including bonding pads formed on a surface of the semiconductor chip, each of the bonding pads being part of a corresponding electrical interconnection;
   a first resin layer disposed on the semiconductor chip and having ridged edges;
   wirings, each being disposed over and electrically connected to a corresponding bonding pad and extending integrally over the first resin layer and over a corresponding ridged edge of the first resin layer; and
   external connection terminals, each being disposed on a corresponding wiring and being electrically connected to the corresponding wiring, and a part of each external connection terminal being disposed above and in vertical alignment with the corresponding ridged edge that the corresponding wiring extends over.

2. A circuit board on which the semiconductor device according to claim 1 is mounted.

3. An electronic apparatus including the semiconductor device according to claim 1.

* * * * *